United States Patent [19]

Turner

[11] Patent Number: 5,143,861
[45] Date of Patent: Sep. 1, 1992

[54] METHOD MAKING A DYNAMIC RANDOM ACCESS MEMORY CELL WITH A TUNGSTEN PLUG

[75] Inventor: Timothy E. Turner, Roanoke, Tex.
[73] Assignee: SGS-Thomson Microelectronics, Inc., Carrollton, Tex.
[21] Appl. No.: 320,064
[22] Filed: Mar. 6, 1989
[51] Int. Cl.$^5$ .............................................. H01L 21/70
[52] U.S. Cl. ........................................ 437/52; 437/47; 437/48; 437/60; 437/192; 437/228
[58] Field of Search ................... 437/38, 47, 48, 51, 437/52, 60, 61, 67, 191, 192, 193, 195, 203, 228, 233, 235, 919, 944, 200; 357/23.6, 51

[56] References Cited

U.S. PATENT DOCUMENTS

| | | | |
|---|---|---|---|
| 4,495,219 | 1/1985 | Kato et al. | 437/919 |
| 4,644,386 | 2/1987 | Nishizawa | 357/23.3 |
| 4,742,018 | 5/1988 | Kimura et al. | 437/48 |
| 4,855,801 | 8/1989 | Kuesters | 357/23.5 |
| 4,951,175 | 8/1990 | Kurosawa | 357/23.6 |
| 4,958,318 | 8/1990 | Harari | 357/23.6 |
| 4,961,165 | 10/1990 | Ema | 357/23.6 |

FOREIGN PATENT DOCUMENTS

| | | | |
|---|---|---|---|
| 0258657 | 8/1987 | Fed. Rep. of Germany . | |
| 3631371 | 3/1988 | Fed. Rep. of Germany | 357/23.6 |
| 3807162 | 3/1988 | Fed. Rep. of Germany . | |
| 3918924 | 6/1989 | Fed. Rep. of Germany . | |
| 56-58254 | 5/1981 | Japan . | |
| 0258467 | 11/1986 | Japan . | |
| 62-86853 | 4/1987 | Japan . | |
| 62-286270 | 12/1987 | Japan . | |
| 63-002363 | 6/1988 | Japan . | |
| 0278363 | 11/1988 | Japan | 357/23.6 |

OTHER PUBLICATIONS

International Electron Devices Meeting, pp. 246-249, Dec. 14, 1988.
Trends and Directions in VLSI Memory Technology, vol.3, pp. 1056-1061, Aug. 25-28, 1987.

*Primary Examiner*—Tom Thomas
*Attorney, Agent, or Firm*—Gregory Howison; Kenneth C. Hill; Lisa K. Jorgenson

[57] ABSTRACT

A method for forming a memory cell for a dynamic random access memory includes the steps of first forming the transistors having gate electrodes (34) and source/drain regions (44) on either side thereof. An isolation trench (48) is formed in one of the source/drain regions with a portion (52) remaining. A masking layer (56) is formed over the surface of the substrate and an opening (62) formed therein to expose the source/drain region (52) and associated tungsten layer (50). A conductive plug (62) is formed in the opening followed by formation of an oxide layer (66). The plug (62) comprises the lower plate of the capacitor and then a conformal layer of conductive material (68) is formed over the surface thereof to comprise the upper plate of the capacitor. A planarized layer of oxide (69) is formed over the substrate and an opening (70) formed therein to expose the other of the source/drain regions (44). A contact plug (76) is formed in the opening (70) followed by formation of the interconnect layer (78).

13 Claims, 4 Drawing Sheets

METHOD MAKING A DYNAMIC RANDOM ACCESS MEMORY CELL WITH A TUNGSTEN PLUG

TECHNICAL FIELD OF THE INVENTION

The present invention pertains in general to memory cells, and more particularly, to a single transistor cell for a dynamic random access memory.

BACKGROUND OF THE INVENTION

Dynamic random access memories at present utilize what is known as a one transistor (1-T) cell to store bits of data. The 1-T cell has the advantage of low parts count, thus producing high density arrays. These cells are typically fabricated in a planar construction utilizing a single capacitor as a storage element and associated with some type of adjacent gate structure which normally is comprised of an MOS transistor. The area of the cell is therefore defined as the area of the transistor, the area of the capacitor and the area of the field isolation between cells.

When the 1-T cell originally came into use, it was fabricated in a planar structure utilizing a diffused region as both the lower plate of the capacitor and the drain of the transistor. The upper plate of the capacitor was fabricated from an upper metal layer separated from the diffused region by a capacitive oxide layer. As photolithographic techniques improved, densities increased without deviating from the planar structure. Although the relative size of the capacitor did decrease somewhat, techniques such as the Hi-C cell enabled the capacity of the capacitor to be increased while the surface area decreased. However, there are limitations to the density that can be achieved with a planar construction due to the minimum size of the transistor, soft error problems, etc.

There have been a number of capacitor construction techniques proposed to overcome the limitations of the planar construction such as trench capacitors and stacked capacitors. Trench capacitors utilize trenches in the substrate in which the capacitors are formed to provide an increased surface area for the capacitor. Stacked capacitors place the capacitor over the transistor to increase the surface area available for the cell.

To date, the only technique that has been utilized with any success in high density DRAMs is the trench capacitor cell. However, this procedure requires not only fabrication of repeatable trenches, but also formation of the capacitor oxide and upper plate of the capacitor within a trench. At present, no realizable DRAMs are being produced that allow for fabrication of the memory cell capacitor above the substrate.

SUMMARY OF THE INVENTION

The present invention disclosed and claimed herein comprises a method for forming a memory cell for a dynamic random access memory. The method includes the steps of first forming an MOS transistor on the surface of the substrate. A masking layer is then formed followed by definition of an opening therein to expose a portion of one of the source/drain regions in the transistor. Metal is then deposited in the opening and extending upward from the surface of the substrate to define a plug having an upper surface and at least two sides. A layer of insulating material is then deposited over the substrate followed by the deposition of a layer of conductive material, the layer of conductive material forming the upper plate of the capacitor. A planarized layer of insulating material is formed over the substrate with an opening defined therein to expose the other of the source/drain regions. A contact is formed in this opening to an interconnecting layer on the upper surface of the planarized insulating layer.

In another aspect of the present invention, the gate electrode in the MOS transistor has a protective insulating layer formed thereover. The opening in the masking layer is disposed such that it overlaps a portion of the gate electrode to provide an increased surface area for the lower plate of the capacitor. The lower plate of the capacitor is formed by sputtering tungsten onto the substrate such that it is built upward to the dimensions of the opening.

In yet another aspect of the present invention, a plurality of transistors are disposed in an array wherein the conductive layer forming the upper electrodes of the capacitor comprises a continuous sheet that is common to at least a portion of the transistors in the array.

BRIEF DESCRIPTION OF THE DRAWINGS

For a more complete understanding of the present invention and the advantages thereof, reference is now made to the following description taken in conjunction with the accompanying Drawings in which.

Figure 1:
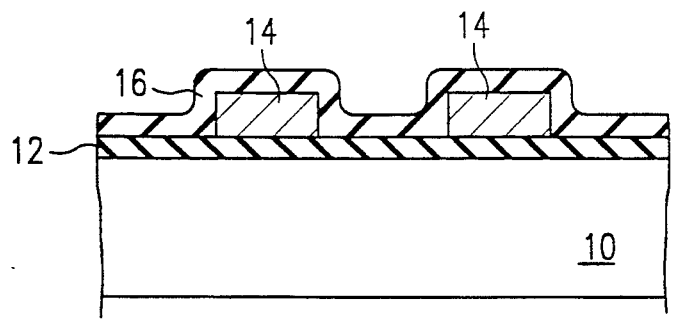
FIG. 1 illustrates a cross-sectional diagram of a semiconductor substrate wherein a pattern for isolation trenches is defined on the surface thereof.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

DETAILED DESCRIPTION OF THE INVENTION

Referring now to FIG. 1, there is illustrated a cross-sectional diagram of a semiconductor substrate 10 which, in the preferred embodiment, is comprised of a P-type semiconductor material that is doped to a suitable level. A layer of silicon nitride 12 is deposited onto the substrate 10 to a thickness of approximately 2000 Angstroms. Thereafter, a conformal layer of polycrystalline silicon (poly) is deposited onto the substrate by chemical vapor deposition (CVD) techniques to a thickness of approximately 6000 Angstroms. This conformal layer is patterned and then etched by conventional techniques to form a plurality of longitudinal poly members 14 on the upper surface of the silicon nitride layer 12. Each of the poly members 14 is separated by a predetermined distance. Thereafter, a conformal layer 16 of silicon dioxide is deposited to a thickness of approximately 3000 Angstroms.

Figure 2:
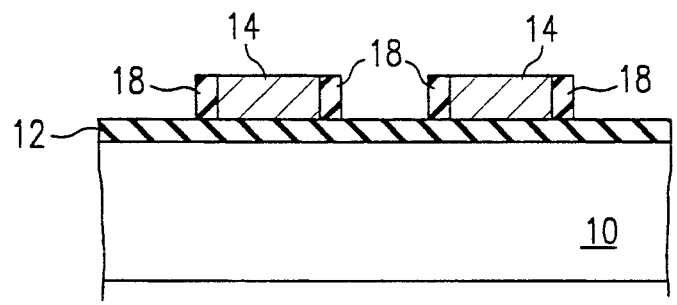
FIG. 2 illustrates the substrate of FIG. 1 after formation of sidewall oxides layers on poly strips.

With reference to FIG. 2, the layer 16 is anisotropically etched to remove all portions of the layer 16 on essentially horizontal surfaces. This results in sidewall oxide layers 18 on the vertical sidewalls of each of the poly members 14. The thickness of these sidewall oxide layers 18 is a function of the thickness of the layer 16.

Figure 3:
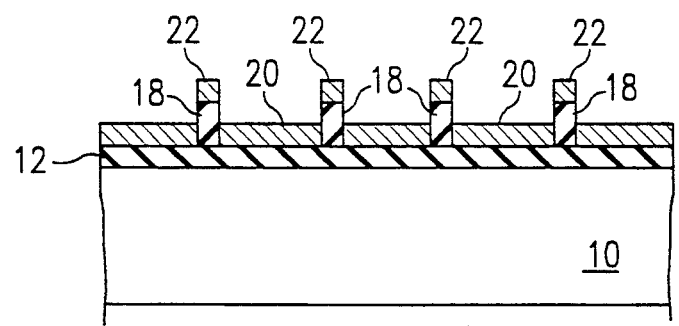
FIG. 3 illustrates the substrate of FIG. 2 after etching the poly layer away followed by deposition of a layer of titanium.

As illustrated in FIG. 3, after formation of the sidewall oxide layers 18, the poly members 14 are removed with a selective etch leaving behind the sidewall oxide layers 18. Thereafter, titanium is sputtered onto the substrate to a thickness of approximately 2000 Angstroms. In this process, it is desirable to have the titanium sputtered on in as directional a manner as possible. Therefore, the sputtering operation is performed at low pressure without backfilling with an inert gas such as argon. This results in a much more directional sputtering operation with a layer 20 of titanium approximately 2000 Angstroms thick, both on the substrate between the sidewall oxide layer 18 and a layer 22 disposed on the upper surface of sidewall oxide layers 18. Since the poly members 14 were approximately 6000 Angstroms in height, the height of the sidewall oxide layers 18 is also approximately 6000 Angstroms in thickness. This results in approximately 4000 Angstroms along the vertical edge of the sidewall oxide layers 18 that is not covered by the titanium layer 20 or the titanium layer 22. By wet etching the sidewall oxide layers 18, the oxide is selectively removed, thus removing both the sidewall oxide portions 18 and the layer 22. This wet etching process does not significantly etch the silicon nitride layer 12.

Figure 4:
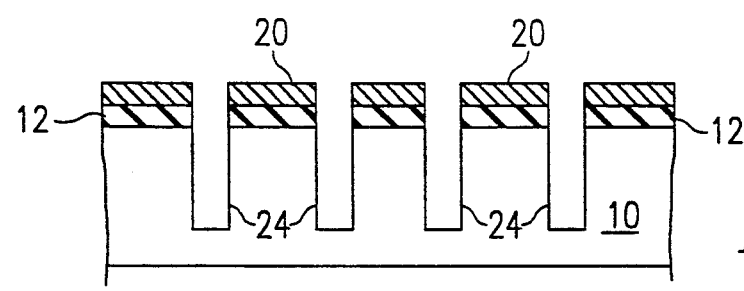
FIG. 4 illustrates the substrate of FIG. 3 after formation of the isolation trenches therein.

As illustrated in FIG. 4, the exposed portion of the silicon nitride is selectively etched by a plasma etch process with the titanium layers 20 functioning as a mask to form trenches 24. The etching process utilizes a fluorine base etch such as $SF_6$. The trench 24 are approximately 8,000 Angstroms in depth, and it can be seen that the width of the trench is approximately equal to the thickness of the sidewall oxide portions 18 or approximately 3000 Angstroms The width of the active area between the trenches is approximately 0.8 to 1.1 microns.

Figure 5:
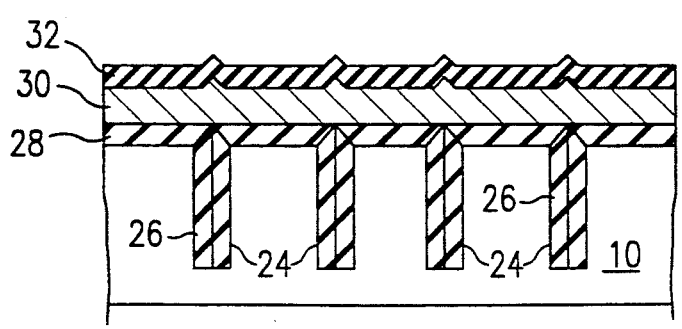
FIG. 5 illustrates a cross-sectional view of the substrate of FIG. 4 after removal of the titanium, formation of oxide in the trenches, deposition of a layer of poly silicon, and deposition of an oxide layer.

As illustrated in FIG. 5, after formation of the trenches 24, the titanium portions 20 are removed, leaving behind the remaining portions of the silicon nitride layer 12 on either side of the trenches 24 (not shown). The substrate is then subjected to a thermal oxidation step, resulting in the formation of oxide 26 internal to the trenches 24. Thereafter, the remaining portions of the silicon nitride layer 12 are removed and then a layer of strip gate oxide (not shown) is grown over the substrate. The substrate is then subjected to a threshold adjust implant which is utilized to adjust the impurity level at the surface of the substrate for later formation of transistors. This is a conventional process. After the threshold adjust implant is performed, the layer of strip gate oxide is removed and then a layer 28 of gate oxide is grown on the surface of the substrate. This is followed by CVD deposition of a layer 30 of poly followed by thermal oxidation thereof to form a layer of oxide 32 on the upper surface of the poly 30.

Figure 6:
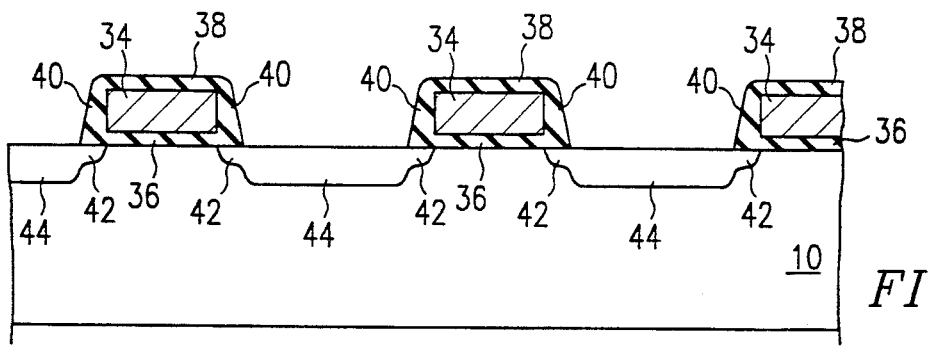
FIG. 6 illustrates a cross-sectional view of the substrate of FIG. 5 taken at a 90° angle with respect to the cross-section of FIG. 5 and illustrating the patterning of the transistor gate.

In order to describe the remaining steps of the process, the cross-sectional diagram illustrated in FIGS. 1-5 is rotated 90° such that the cross-section is taken between two of the trenches 24 along an active area. As illustrated in FIG. 6, the gate oxide layer 28, poly layer 30 and oxide layer 32 are patterned and etched to form longitudinal gate electrodes 34 which are separated from the substrate by a layer of gate oxide 36. The layer of gate oxide 36 is formed from the gate oxide layer 28 in FIG. 5. Each of gate electrodes 34 has a capping layer 38 of oxide on the upper surface thereof which is the remaining portion of the oxide layer 32 after the patterning and etching process.

After formation of the gate electrodes 34 with the capping layer 38 and the gate oxide layer 36, the substrate is subjected to a light implant which is of a dosage sufficient to form a lightly doped drain (LDD) transistor. This is a conventional process. After performing the light implant, the substrate is covered with a conformal layer of silicon oxide (not shown) and then the oxide is layer anisotropically etched to form sidewall layers 40 on either side of the gate electrode 34. The portion of the light implant under the sidewall oxide layers is represented by a region 42 which is sometimes referred to as a reach-through implant. The substrate is then subjected to a heavy source/drain implant of N-type impurities to a concentration suitable to form highly conductive source/drain regions 44. Each of the source/drain regions 44 is connected to the channel region underlying the gate electrodes 34 by the reach-through implants 42.

Figure 7:
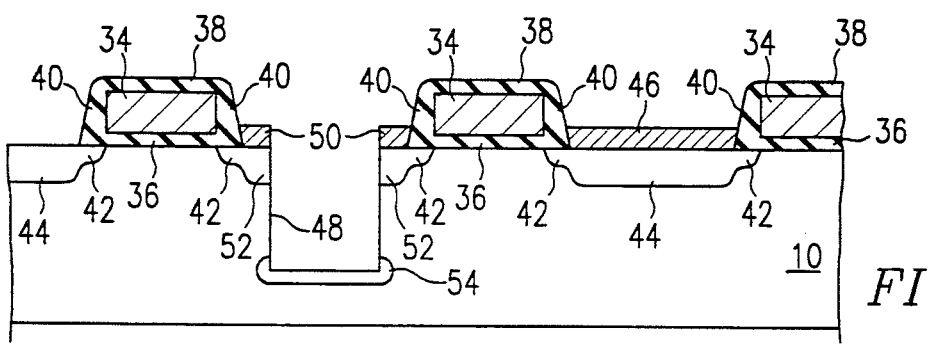
FIG. 7 illustrates the step of forming the capacitor trench in the substrate of FIG. 6.

As illustrated in FIG. 7, after formation of the source/drain implants 44, tungsten is selectively deposited onto the substrate by CVD techniques. In the selective deposition technique, tungsten is only deposited on bare silicon. Since the upper surface of each of the gate electrodes 34 has a protective capping layer 38 of oxide disposed thereon, the tungsten will only be deposited on the portion of the substrate lying between adjacent gate electrodes 34 and the associated sidewall oxide layers 40. This results in a layer 46 of tungsten being formed over the surface of the source/drain implants 44.

After formation of the tungsten layer 46 between adjacent ones of the gate electrodes 34 over the source/drain implants 44, the substrate is patterned to define isolation trenches 48. The isolation trenches 48 are defined between every other gate electrode along a given cross-sectional line between two adjacent ones of the isolation trenches 24. After defining the isolation trenches 48, the substrate is etched to define the trenches 48 with the edges thereof disposed away from the edges of the sidewall oxide layers 40 by a predetermined distance. This results in a portion 50 of the tungsten layer 46 remaining on either side of each of the trenches 48 and also a portion 52 of the source/drain implant 44. It is a necessary to have this portion 50 remaining to provide a conductive surface. After formation of the trench 48, a field implant is performed on the bottom surface thereof, resulting in the formation of a P-type field implant region 54 at the bottom of the trench 48 slightly higher in concentration than the substrate 10.

Figure 8:
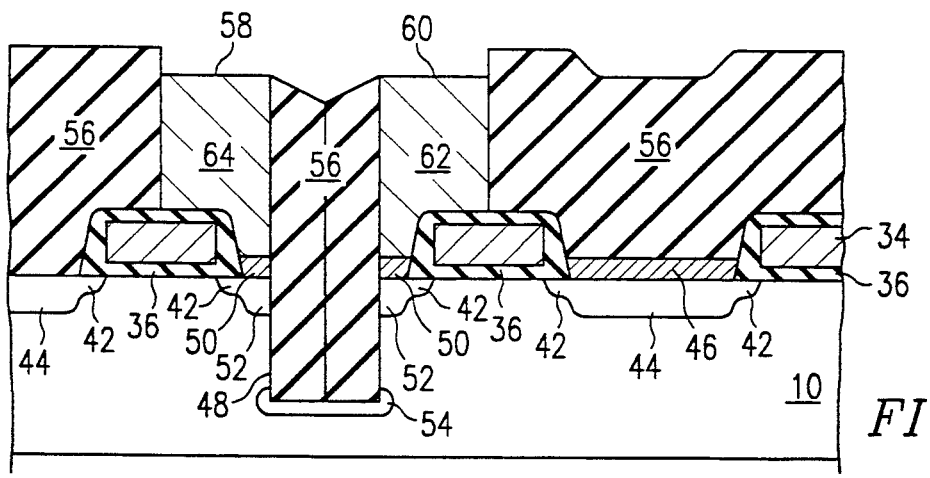
FIG. 8 illustrates the step of forming the lower conductive plate of the capacitor.

As illustrated in FIG. 8, after formation of the trenches 48 and the field implant 54, a layer 56 of silicon nitride is deposited to a thickness of approximately 30,000 Angstroms. Alternatively, a layer of poly imid, can be deposited. The silicon nitride layer 56 is then patterned to define an opening 58 and an opening 60 on either side of the trench 48 extending from approximately the center of each of the adjacent electrodes 34 and the edge of the trench 48. Tungsten is then selectively deposited in the openings 58 and 60, which openings 58 and 60 expose the portions 50 of the tungsten layer. Tungsten is selectively deposited such that it grows upward from the portion 50 to form a tungsten plug 62 in the opening 60 and a tungsten plug 64 in the opening 58. This deposition is performed by CVD techniques at a low pressure for approximately one to two hours to achieve the thickness of the plugs of approximately 25,000–35,000 Angstroms. Although the portions 50 of tungsten were provided, it is possible to deposit the tungsten directly on the silicon surface of the source/drain regions underlying the portions 50. However, this is slower.

As illustrated in FIG. 8, after formation of the tungsten plugs 62 and 64, the silicon nitride mask 56 is removed and then a layer of titanium dioxide is deposited by CVD techniques to a thickness of approximately 1,000 Angstroms to form an insulating capacitor oxide layer 66 over the entire substrate and conformally covering the surface of the tungsten plugs 62 and 64 and the surfaces of the trench 48. Titanium dioxide is utilized because it has a much higher dielectric constant but a lower breakdown voltage than comparable silicon dioxide dielectric material. Since a much thicker capacitor oxide layer is provided, this allows a considerable amount of tolerance during manufacturing with a resultant improvement in capacitor oxide integrity.

After formation of the capacitor oxide layer 66, a layer of tungsten 68 is deposited over the substrate by CVD techniques to a thickness of approximately 2,000 Angstroms. This layer comprises the upper electrode of the capacitor. It can be seen that the lower electrode of the capacitor, represented by the tungsten plug 62 and the portion 50 and also by the tungsten plug 64 and the portion 50, are connected to the source/drain region on one side of gate electrode 34. The portion of the titanium dioxide layer 46 between the layer 68 and the plug 62 comprises the capacitor dielectric.

Figure 9:
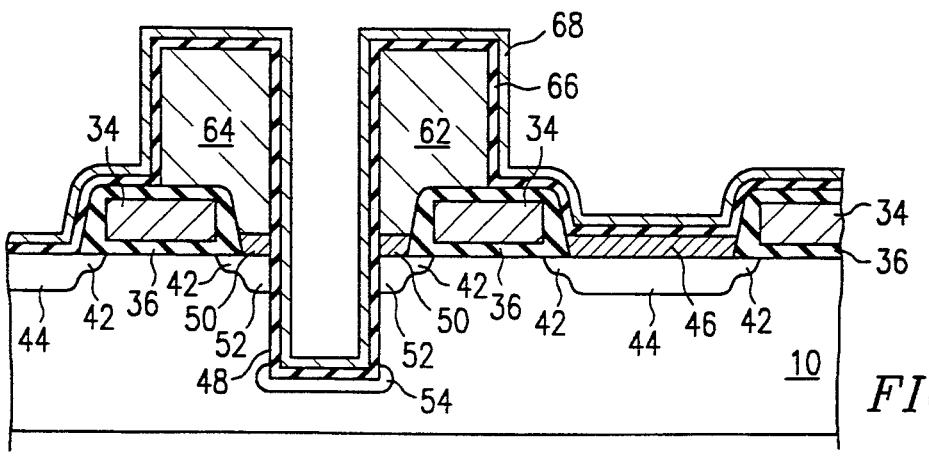
FIG. 9 illustrates the step of forming the upper capacitor plate.
Figure 10:
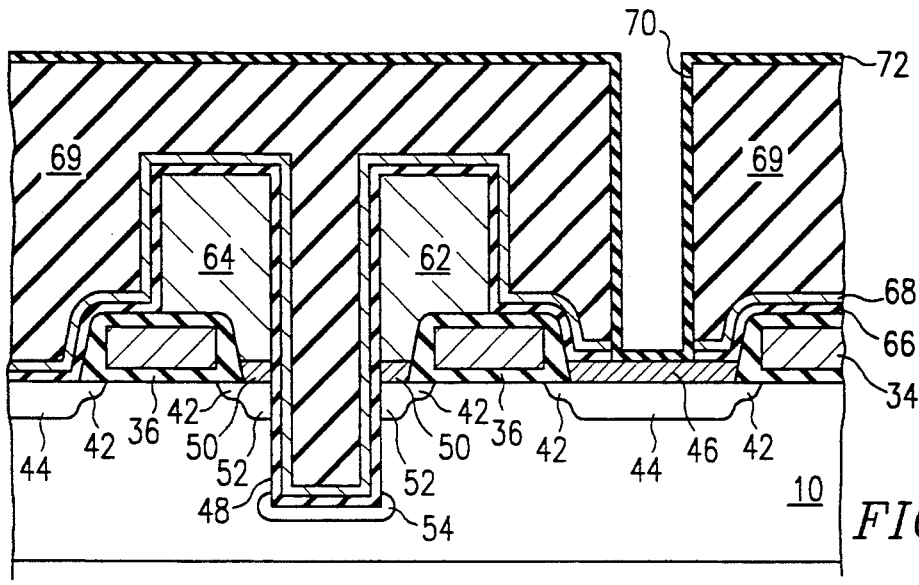
FIG. 10 illustrates the step of forming the contact opening to the source/drain of the transistor.

As illustrated in FIG. 9, after formation of the layer 66, it is necessary to form a contact with the source/drain region 44 on the opposite side of the gate electrode 34 from the region 50. This typically comprises the bit-line in a memory array. The contact is formed by first forming a layer 69 of spin-on glass (SOG) to a thickness of approximately 40,000 Angstroms over the substrate. This provides a planar surface. A contact opening 70 is formed through the SOG layer 69 to expose the upper surface of the tungsten layer 68 overlying the source/drain region 44 on the opposite side of the gate electrode 34 from the portion 50. The exposed portion of the tungsten layer 68 and the underlying titanium dioxide layer 66 is then etched to expose the surface of the tungsten layer 46 adjacent to the surface of the source/drain region 44. The tungsten layer 68 is typically etched with a chlorine-based plasma etch whereas the titanium dioxide is etched with an F-based etch. A layer 72 of nitride is then deposited in a conformal manner over the substrate to a thickness of approximately 2,000 Angstroms.

Figure 11:
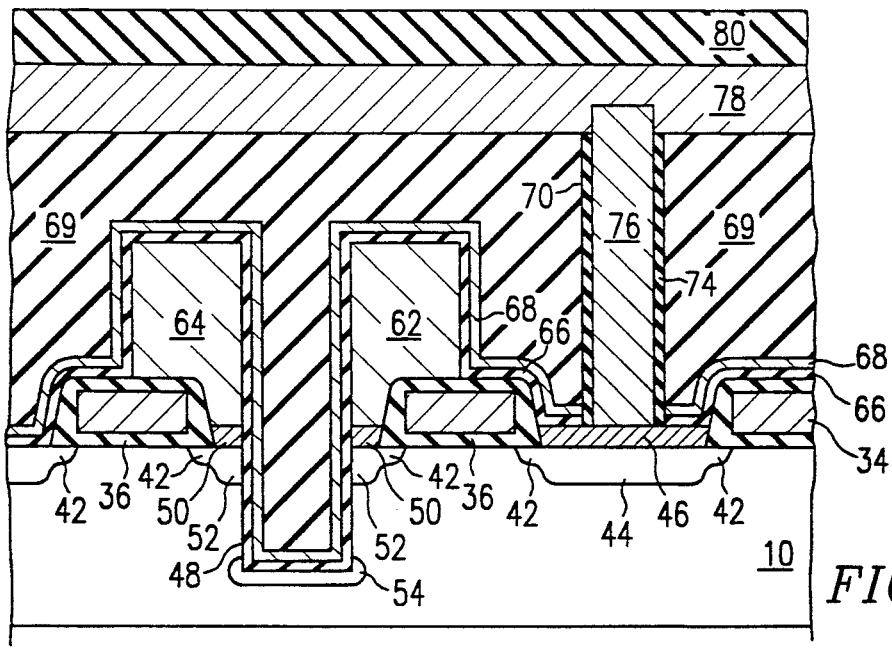
FIG. 11 illustrates formation of the conductive plug in the contact opening.

As illustrated in FIG. 11, after deposition of the layer of nitride 72, the nitride layer 72 is anisotropically etched, removing the portion of the nitride layer 72 on the upper surfaces of the SOG layer 69 and also on the horizontal surface of the tungsten layer 46 overlying the source/drain region 44. A sidewall nitride layer 74 remains on the sidewalls of the contact opening 70. The contact opening 70 is then filled with a selective deposition of tungsten to provide a plug 76. Thereafter, an aluminum interconnect layer 78 is formed which comprises the bit line which is then covered by a layer of oxide 80.

To form the aluminum interconnect layer 78, the process described above with respect to FIGS. 1–4 for forming the titanium layers 20 is utilized. A layer of poly is deposited over the substrate by CVD techniques and then an interconnect pattern is defined therein with longitudinal poly lines. This is followed by deposition of oxide to form a conformal layer. This is then anisotropically etched with a plasma etch to leave a sidewall oxide region on each of the longitudinal poly lines. The poly lines are then etched away leaving behind the sidewall oxide layers. Aluminum is then sputtered onto the substrate resulting in aluminum being disposed on the surface of the SOG layer 69 between the sidewall oxide runs and also being disposed on the upper surface of the sidewall oxide runs. The oxide is then etched removing the oxide and the portion of the aluminum on the upper surface of the oxide. This results in the aluminum runs in the interconnect layer 78 being formed which are perpendicular to the gate electrodes 34. The oxide layer 80 is then deposited on the upper surface.

Figure 12:
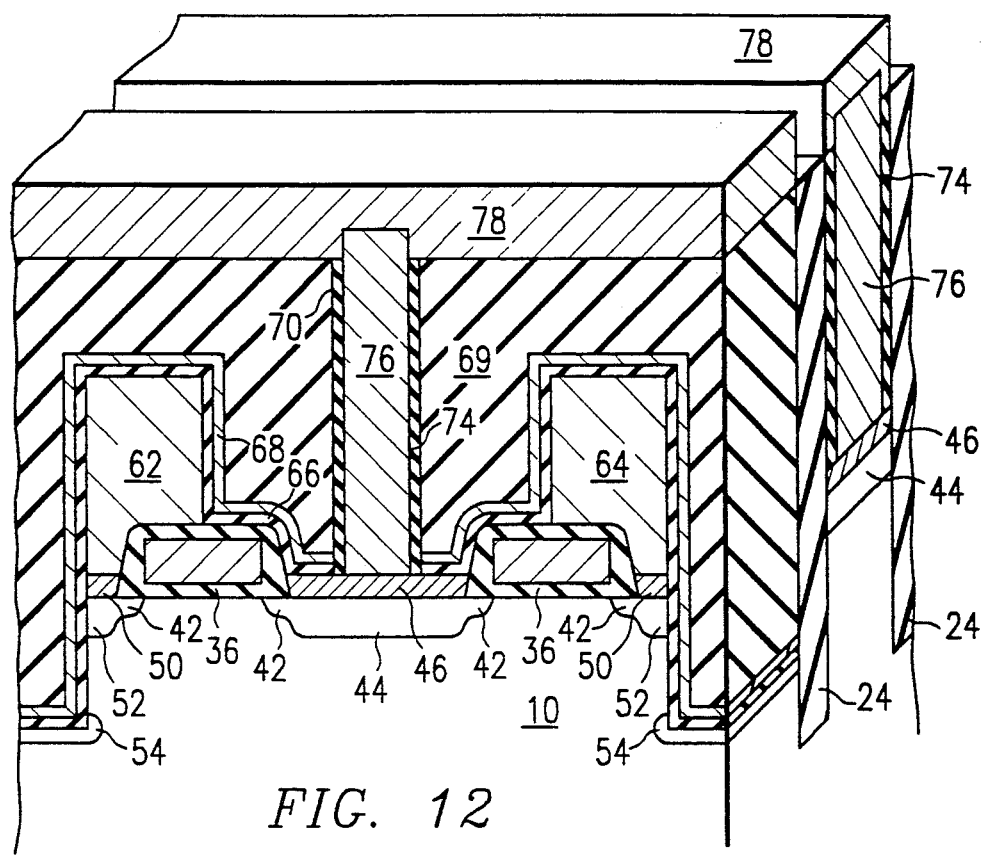
FIG. 12 illustrates an isometric view of the transistor structure.

Referring now to FIG. 12, there is illustrated an isometric view of the capacitor in a cut-away view illustrating the aluminum interconnect layer 78 without the upper layer of oxide 80. It can be seen that the capacitors are staggered such that every other source/drain region along either the x-axis or the y-axis is configured to form a bit-line connection. It can also be seen that the plugs 62 and 64 forming the lower plates of the capacitors are formed in a three-dimensional manner such that there is one upper surface and four essentially vertical surfaces. Therefore, when the titanium dioxide layer 66 is deposited, it is deposited on all exposed surfaces followed by deposition of the upper plate of the capacitor as layer 68. Layer 68 forms the upper plate of all of the capacitors in the array in a continuous sheet, which sheet covers the upper surface and all four exposed substantially vertical surfaces of the titanium dioxide layer 66. This results in a significant increase in the area of the capacitor without substantially increasing the overall area of the cell. This is due to the fact that the capacitor contacts only a portion of one of the source/drain regions 44 and extends upward from the substrate and overlaps the gate electrode.

Figure 13:
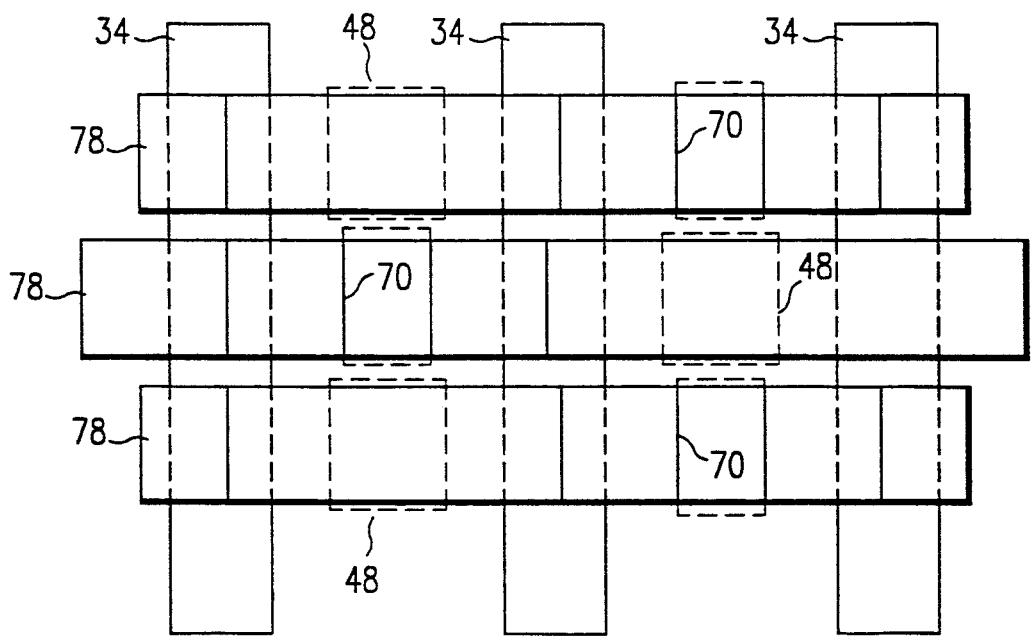
FIG. 13 illustrates a top view of the transistor structure without the upper connecting layer.

Referring now to FIG. 13 there is illustrated a top view of the structure of FIG. 12 illustrating six transistors and their associated capacitors. In the top view, it can be seen that the space in between the aluminum lines in the interconnect layer 79 are minimized due to utilizing the above-described process and that each of the cells occupies only a minimal space. Since the capacitor extends upward from the substrate, the conventional "dog bone" configuration need not be utilized. Rather, each cell is essentially a rectangular configuration with the isolation between the cells provided by both the isolation trenches 24 and the isolation trenches 48. The isolation trenches 24 provide isolation along one axis whereas the isolation trenches 48 provide isolation along the other axis.

Although the preferred embodiment has been described in detail, it should be understood that various changes, substitutions and alterations can be made therein without departing from the spirit and scope of the invention as defined by the appended claims.

I claim:

1. A method for forming a memory cell for a dynamic random access memory, comprising:
   providing a substrate having at least one surface;
   forming an MOS transistor on the surface of the substrate having a gate electrode separated from the surface of the substrate by a layer of gate oxide to define a channel thereunder, the transistor having source/drain regions on either side of the channel;
   forming a layer of insulating material over the gate electrode of the MOS transistor on all sides thereof and on the upper surface thereof;
   forming a layer of tungsten on one source/drain region;
   forming a layer of masking material over the transistor;
   patterning the masking layer to define an opening to expose at least a portion of the layer of tungsten disposed over the one source/drain region and a portion of the layer of insulating material over the gate electrode;
   depositing tungsten in the opening such that it builds upward from the exposed portion of the tungsten layer to create an essentially vertical plug having an upper surface and at least two side surfaces, the plug defining the lower plate of a storage capacitor;
   removing the masking layer and depositing a conformal layer of insulating material over the plug and transistor;
   forming a conformal layer of conductive material over the conformal layer of insulating material, the portion of the conformal conductive layer overlying the plug comprising the upper plate of the storage capacitor;
   forming a planarized layer of insulating material over the conductive layer;
   forming an opening through the planarized layer of insulating material, the conformal conductive layer and the conformal layer of insulating material to expose the other of the source/drain regions of the MOS transistor; and
   forming a contact in the opening.

2. The method of claim 1 wherein the conformal layer of insulating material comprises titanium dioxide.

3. The method of claim 1 wherein the conformal layer of conductive material comprises the upper plate of the storage capacitor in a plurality of adjacent memory cells in an array of like memory cells.

4. The method of claim 1 wherein the step of forming the contact comprises:
   forming a layer of tungsten over the other of the source/drain regions prior to forming the first layer of masking material over the transistor;
   exposing the upper surface of the tungsten layer during the step of forming the opening in the second layer of insulating material;
   forming a layer of insulating material on the sidewalls of the opening to insulate the portion of the conformal conductive layer adjacent to the opening;
   depositing tungsten in the opening such that it is formed upward from the exposed surface of the tungsten layer over the other of the source/drain regions; and
   forming a conductive interconnect pattern on the upper surface of the planarized layer of insulating material and contacting the tungsten in the bottom of the opening.

5. The method of claim 1 wherein the plug has four side surfaces.

6. A method for forming a memory cell for a dynamic random access memory, comprising:
   providing a semiconductor substrate;
   forming an MOS transistor on one surface of the semiconductor substrate having a gate electrode separated from the surface of the substrate by a layer of gate oxide and source/drain regions on either side of the gate electrode;
   forming a layer of insulating material over the exposed surfaces of the gate electrode;
   forming a layer of tungsten over the source/drain regions;
   forming a layer of masking material over the transistor;
   patterning the masking layer to define an opening over at least a portion of one of the source/drain regions to expose the tungsten layer on the surface thereof;
   depositing tungsten in the opening such that the tungsten builds up from the exposed surface of the tungsten layer on the surface of the one source/drain region and extending upward through the opening to form a plug having an upper surface and at least two side surfaces, which plug comprises the lower plate of a memory cell storage capacitor;
   removing the masking layer;
   depositing a conformal layer of insulating material over the plug and the transistor;
   depositing a conformal layer of conductive material over the conformal layer of insulating material, the portion of the conformal layer of conductive material overlying the plug comprising the upper electrode of the capacitor;
   forming a planarized layer of insulating material over the substrate;
   forming an opening through the planarized layer of insulating material, the conformal conductive layer and the conformal layer of insulating material to expose at least a portion of the upper surface of the tungsten layer over the other of the source/drain regions;
   forming a sidewall insulating layer on the sidewalls of the opening in the planarized layer of insulating material to insulate the portion of the conformal conductive layer proximate to the opening;
   depositing tungsten in the opening such that it is formed upward from the surface of the exposed portion of the tungsten layer overlying the other of the source/drain regions; and
   forming a conductive pattern on the upper surface of the second layer of insulating material.

7. The method of claim 6 wherein the step of forming the opening in the masking layer comprises forming the opening such that it overlaps a portion of the gate electrode.

8. The method of claim 6 wherein the conformal layer of insulating material comprises titanium dioxide.

9. A method for forming memory cells in a dynamic random access memory array, comprising:
   providing a semiconductor substrate;
   forming a plurality of longitudinal gate electrodes on the surface of a substrate and separated from the surface of the substrate by a layer of gate oxide, said longitudinal gate electrodes substantially evenly spaced apart;
   forming source/drain regions between the longitudinal gate electrodes;
   forming isolation trenches in alternating ones of the source/drain regions, a portion of the source/drain region in which each of the isolation trenches was formed remaining on either side of the isolation trench;
   forming a masking layer over the transistors and the isolation trenches;
   forming openings in the masking layer to expose at least a portion of each of the portions of the source/drain regions adjacent to the isolation trenches;
   depositing a layer of conductive material in the openings and extending upward from the remaining portion of the source/drain regions adjacent each of the isolation trenches to the surface of the masking layer to form a plug in each of the openings that comprises the lower plate of a memory cell storage capacitor;
   removing the masking layer;
   forming a conformal layer of insulating material over the plugs the transistors and the isolation trenches;
   forming a conformal layer of conductive material over the conformal layer of insulating material;
   forming a planarized layer of insulating material over the conformal layer of conductive material;
   forming a plurality of openings through the planarized layer of insulating material, the conformal layer of conductive material and the conformal layer of insulating material to expose a portion of each of the other of the source/drain regions on the opposite side of the gate electrodes from the isolation trenches;
   forming a contact in each of the openings to the exposed portions of the other of the source/drain regions; and
   forming an interconnect pattern on the upper surface of the second layer of insulating material between the contacts and peripheral circuitry on the substrate.

10. The method of claim 9 and further comprising forming a field implant in the bottom of the isolation trenches prior to forming the masking layer.

11. The method of claim 9 and further comprising forming a layer of tungsten over the source/drain regions in which the trenches are formed after formation of the source/drain regions and wherein the conductor material of the plug is tungsten that is formed by depositing tungsten upward from a portion of the tungsten layer remaining over the source/drain regions adjacent to the isolation trenches.

12. The method of claim 9 and further comprising forming a layer of insulating material over each of the gate electrodes prior to forming the masking layer and wherein each of the openings formed in the masking layer overlap each of the associated gate electrodes.

13. The method of claim 9 wherein the first layer of insulating material in titanium dioxide.

* * * * *